Sept. 28, 1965 C. S. DUNCAN ETAL 3,208,835
THERMOELECTRIC MEMBERS
Filed April 27, 1961
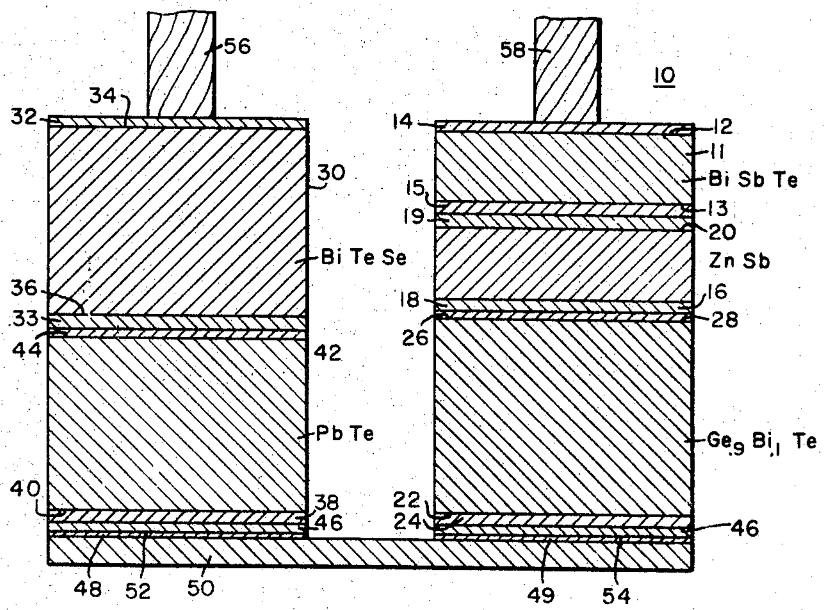

United States Patent Office 3,208,835
Patented Sept. 28, 1965

3,208,835

THERMOELECTRIC MEMBERS

Charles S. Duncan, Penn Hills, and Herbert L. Taylor, Murrysville, Pa., assignors to Westinghouse Electric Corporation, East Pittsburgh, Pa., a corporation of Pennsylvania Filed Apr. 27, 1961, Ser. No. 105,859
2 Claims. (Cl. 29—195)

The present invention relates to thermoelectric elements and a process for producing the same.

Heretofore in the preparation of thermoelectric devices, great difficulty has been encountered in applying metal contacts to the body of thermoelectric material proper. It is desirable in preparing a thermoelectric element that the metal contact immediately touching the the body of thermoelectric material be non-reactive with the thermoelectric material. Furthermore the contact must form a sound and continuous joint therewith. The contact must be extremely well bonded to the thermoelectric body so that it will not loosen even under great thermal stresses. Also, the metal contacts must be non-reactive with any other contact materials or electrical conductors applied thereto. Since the thermoelectric devices produced will be subjected to fluctuations in temperature and pressure differentials, the device will be exposed to numerous stresses while in operation that it must withstand without failure at the joints. Therefore, the materials employed for the thermoelectric material, metal contacts and conductors must be non-reactive and compatible with each other both thermally and electrically so that relatively good joints of low electrical resistance may be provided between the successive layers of materals employed to prepare the thermoelectric device.

The object of the present invention is to provide a body of semiconductor compound material and at least one relatively thin plasma jetted metallic contact coating on the end surfaces of the body.

Another object of the invention is to provide a thermoelectric element comprising a body of semiconductor compound material and at least one relatively thin plasma jetted coating on the end surfaces of the body, the coating being of the order of 0.003 inch in thickness, the coating serving as a diffusion barrier and being a metal having good electrical and thermal conductivity as well as good solderability, the coating having been applied by plasma jet spraying it to secure good adhesion and bonding to the body of material in order to provide for lowest electrical resistance.

Other objects of the invention will, in part, be obvious and will, in part, appear hereinafter.

In order to more fully understand the scope of the invention, reference should be had to the following detailed description and drawing, the single figure of which is an elevation view in cross-section of a thermo-electric element produced in accordance with the teaching of the invention.

In accordance with the present invention and in attainment of the foregoing objects, there is provided a previously prepared body of semiconductor compound material, either cast, pressed or sintered to shape which material is a reaction product of at least one element of the group consisting of sulfides, selenides and tellurides of at least one element of the group consisting of lead, bismuth, germanium, silver, zinc, antimony, cerium and samarium or a compound material selected from groups III and V of the Periodic Table, with at least one relatively thin plasma jetted coating on the end surfaces of the body, the coating having been applied by plasma jet spraying so that a sound, highly adherent continuous joint is formed between the coating and the body of thermoelectric material in order to provide for lowest electrical resistance at the joint. The coating should have an exposed surface that may readily be soft or hard soldered to an electrical conductor such as copper.

The term "plasma jetted" is descriptive of a coat applied by plasma jet spraying. Such coatings comprise particles of a material carried in a high temperature—up to 15,000° C. to 25,000° C.—gaseous plasma whereby at least the surfaces of the particles are at an elevated temperature and are molten, and projected at an extremely high velocity so that the particles when impinged on a surface will be driven partly into the surface and are tenaciously bonded thereto. Surfaces with coatings applied by plasma jet techniques have typical characteristics that distinguish them from conventional sprayed coatings. Thus, tenaciously adherent bonds are obtained between highly dissimilar materials.

It should be understood that while only one layer of a coating material is sufficient on the thermoelectric body in some instances, it will be necessary in many cases to apply two coatings or even three coatings in order to provide a metal contact with the desired characteristics, to wit, diffusion barrier layer and an outermost solderable layer with good electrical and thermal conductivity.

The coatings must be applied to produce a uniform layer free from pin-holes or openings. The coating should be at least .003 inch thick. However, in some cases the coating may be as thin as .001 inch when applied carefully to produce a uniform layer free from flaws, openings or other defects. Coatings of thicknesses of up to 0.010 inch or even more may be applied.

The bodies of thermoelectric material may be pressed, cast or sintered into a solid homogeneous shape, and should be cleaned to remove loose particles, oxidized or degraded material. In some cases they may be cleaned and the surface roughened by sand blasting so as to present a better bonding surface to the stream of metal applied by the plasma jet spray.

The coating in immediate contact with the semiconductor compound material serves primarily as a diffusion barrier and may comprise one or more of the materials tungsten, molybdenum, nickel, iron, cobalt, stainless steel or other alloys or electrically conductive refractory compounds such as molybdenum disilicide. The coating should not dissolve in or with the thermoelectric material or otherwise react therewith at any temperature of use. The coating is applied by a high velocity conventional plasma jet spray gun to insure an outstanding joint between the metal and the thermoelectric material. The specific metal that is to be employed with a given thermoelectric material depends on its non-reactivity and general compatibility with that thermoelectric material, that is, its ability to form a good bond thereto having low electrical resistivity characteristics. In some cases, the first metal coating applied to the thermoelectric body may be selected for some specific characteristics as low electrical resistance even though it does not completely prevent the thermoelectic material from diffusing through the coating to the other metal conductors such as a copper contact that may be attached thereon and therefore a second plasma jet sprayed coating of a highly diffusion resistant material may be desirable to compensate for the deficiencies of the first coating. However, in most cases only two coatings are required, wherein the outermost coating is a metal consisting predominantly of a good electrical and thermal conductor such as nickel, copper or silver. The outermost coating should be readily solderable with either a soft solder such as a 70–30 lead tin solder or a hard solder such as silver brazing alloy, for instance.

In Table I there is shown the various metallic coatings that may be applied by plasma jet spraying the end surfaces of specific thermoelectric materials. Each coating was 0.003 inch thick. Where more than one material is listed for the first or second coating, each one was applied to the given thermoelectric material, and then a material forming the second coating was applied. However, two or more layers of each coating or blends of two or more can be applied before the second coating material is applied. Thus on germanium telluride, a first coating comprising a layer of molybdenum, then a layer of cobalt is plasma jetted, a second coat of nickel is plasma jetted, and a third coat of copper is plasma jetted. All the specified thermoelectric materials have been pressed and sintered to shape, some also were in cast shapes, and all have been coated with the metals listed in Table I with good results.

TABLE I

*Thermoelectric materials and coatings which have been successfully plasma jet sprayed*

| Thermoelectric material | First coat (about 0.003 inch) | Second coat (about 0.003 inch) | Third coat (about 0.003 inch) |
|---|---|---|---|
| In As P | W, Mo | Ni | |
| Ge Te | W, Mo, Ni, Fe, Co. | Ni, Cu, Fe | Cu. |
| GeBiTe | Mo, Fe, Co, Stainless Steel. | Fe, Cu | Cu. |
| Zn Sb | Ni, Fe, (FE+Mo), Mo, Mo, $Si_2$. | Cu, Fe | Cu, Ag. |
| Ag Sb Te | Mo, Fe | Fe, Cu | Cu. |
| Ag Sb Bi Te compositions. | Fe | Cu | |
| PbTe (N) | W, Mo, Ni, Fe, (Fe+Mo) Mo, $Si_2$ Stainless Steel. | Ni, Cu, Fe, Stainless Steel. | Cu, Ag. |
| PbTe (P) | Mo, Co | Fe | Cu. |
| Bi Sb Te | Mo | Fe | Cu. |
| Bi Te Se | Mo | Fe | Cu |
| $Sm_4S_3$ | Ni, Fe | Cu | |
| Bi Te | Ni | | |

In Table II, there is shown preferred combinations of thermoelectric materials and coating materials. It should be noted that in some cases a third coating has been applied. For example, subsequent to applying by plasma jet spraying a thin coating of molybdenum to zinc antimonide, a layer of iron was similarly applied on the molybdenum layer since it more closely matches the thermal expansion of zinc antimonide than the molybdenum or the subsequent copper coating and thereby reduces the stresses. Finally, a layer of copper was plasma jet sprayed on the iron coating because of its good electrical and thermal conductivity and to aid in soldering when an electrical conductor such as a copper bar is joined to the thermoelectric element as an electrical contact thereon in order to complete the thermoelectric device. However, in the case of germanium telluride, only a single layer of iron is necessary to provide the desired diffusion barrier layer characteristics before mentioned and subsequently only a layer of copper is applied.

TABLE II

*Preferred combinations of thermoelectric materials and coating materials selected from Table I*

| Thermoelectric material | First coat | Second coat | Third coat |
|---|---|---|---|
| In As P | Mo | Ni | |
| Ge Te | Fe | Cu | |
| Ge Bi Te | Fe | Cu | |
| Zn Sb | Mo | Fe | Cu. |
| Ag SbTe | Fe | Cu | |
| Ag Sb Bi Te compositions | Fe | Cu | |
| PbTe (N) | Mo | Fe | Cu. |
| PbTe (P) | Fe | Cu | |
| Bi Sb Te | Mo | Fe | Cu. |
| Bi Te Se | Mo | Fe | Cu. |
| $Sm_4S$ | Fe | Cu | |

It should be understood that in producing a thermoelectric device, one or more of the thermoelectric materials listed in Table I may be joined together with intermediate coatings selected from at least the first coat materials at the meeting ends to prevent reaction between dissimilar thermoelectric materials, to form one leg of the device, while another combination of thermoelectric materials may be joined similarly to form the other leg, and the two legs may be electrically connected by means of an electrical conductor such as, a copper or nickel strap joined to the outermost coatings of the outermost bodies of thermoelectric materials in each leg. For example, referring to the figure in forming the P leg 11 of a thermoelectric device 10, a body of bismuth antimony telluride is coated on both ends 12 and 13 with a 3 mil thick layer 14 and 15 of molybdenum by plasma jet spray. This provides both a diffusion layer and a solderable surface. A body of zinc antimonide, is plasma jet coated with a 3 mil thick layer 16 of iron on one end 18 and is joined by solder 19 on its uncoated end 20 to the layer 13 on the bismuth antimony telluride body. Then a body of germanium bismuth telluride is plasma jet coated on one end 22 with a 3 mil thick layer 24 of iron and is joined at the uncoated end 26 with solder 28 to the coating 16 on end 18 of the zinc antimonide body. In forming the N leg 30, a body of bismuth telluride selenide is coated with a 3 mil thick layer 32 and 33 of molybdenum on both ends 34 and 36 by plasma jet spray. A body of lead telluride, coated with a layer 38 of iron by plasma jet on one end 40 is joined by solder 42 at its uncoated end 44 to layer 33 on end 36 of the bismuth telluride selenide body. A 3 mil thick coating 46 of copper is plasma jetted on the iron coated ends 24 and 38 of the joined germanium bismuth telluride and lead telluride bodies and the composite P and N legs 11 and 30 are joined by solders 48 and 49 to a copper strap 50 at the copper coated ends 52 and 54 of both legs. Finally, copper electrical conductors 56 aid 58 may be joined to molybdenum layers 14 and 32.

Since certain changes in carrying out the above process and in the product embodying the invention may be made without departing from its scope, it is intended that the accompanying description be interpreted as illustrative and not limiting.

We claim as our invention:

1. A thermoelectric element comprising a body of semiconductor compound material and at least two successive relatively thin coatings on the end surfaces of the body, each of the coatings being of the order of 0.003 inch in thickness, the coating in immediate contact with the semiconductor compound material serving as a diffusion barrier and being selected from metals and alloys of the group consisting of tungsten, iron, molybdenum, colbalt, nickel and stainless steel, and the outermost coating being a metal and being readily solderable having good electrical and thermal conductivity, the coatings having been applied by plasma jet spraying them to secure good adhesion and bonding to each other and to the body of material in order to provide for lowest electrical resistance.

2. In the process for producing a thermoelctric element, the steps comprising cleaning the ends of a shaped body of semiconductor compound material to remove any oxidized films and applying to the end surfaces by plasma jet spray at least one coating of the order of 0.003 inch in thickness, the coating serving as a diffusion barrier and being a metal having good electrical and thermal conductivity, the coating being intimately bonded to the body of semiconductor compound material.

References Cited by the Examiner

UNITED STATES PATENTS

| | | | |
|---|---|---|---|
| 2,239,771 | 4/41 | Becker | 117—200 |
| 2,865,793 | 12/58 | De Nobel | 117—200 |
| 2,922,869 | 1/60 | Giannini et al. | 117—105 |
| 2,962,394 | 11/60 | Andres | 117—21 X |
| 2,985,893 | 5/61 | Spanos | 317—240 |
| 3,023,390 | 2/62 | Moratis et al. | 117—217 |

OTHER REFERENCES

"Journal of Metals," Vol. 11, January 1959, pp. 40—42.

"Welding Engineer," February 1959, pp. 50 and 51.

RICHARD D. NEVIUS, *Primary Examiner.*